United States Patent [19]

Bisping

[11] Patent Number: 5,377,277

[45] Date of Patent: Dec. 27, 1994

[54] PROCESS FOR CONTROLLING THE SIGNAL-TO-NOISE RATIO IN NOISY SOUND RECORDINGS

[76] Inventor: Rudolf Bisping, Ahornstrasse 19, 45134 Essen, Germany

[21] Appl. No.: 153,902

[22] Filed: Nov. 17, 1993

[30] Foreign Application Priority Data

Nov. 17, 1992 [DE] Germany ............... 4238698

[51] Int. Cl.$^5$ ........................................... H04B 15/00
[52] U.S. Cl. ................................................ 381/94
[58] Field of Search ........................... 381/46, 47, 94

[56] References Cited

U.S. PATENT DOCUMENTS 4,186,280  1/1980  Geiseler .
5,012,519  4/1991  Adlersberg et al. ............... 381/47
5,228,088  7/1993  Kane et al. ........................ 381/47

OTHER PUBLICATIONS

Goeres-Petry, J. & Dell, J. (1990). Erfahrungen der Ueberarbeitung von Archivmaterial untar Einsatz von "Denoise", Declick und Decrackle. In: Bildungswerk des Verbands Deutscher Tonmeister (Hrsg.). Munchen: Verlag K. G. Saur. [Experiments in reworking archival material using denoise, declick, and decrackle. In: Educational Report of the Association of German Sound Engineers (Eds.). Munich: K. G. Saur, Publisher.].

Houpert, J. (1991). NoNoise von Sonic Solutions. Production Partner, 3, pp. 30–35.

Kay, S. M. & Marple, S. L. (1981). Spectrum Analysis-a Modern Perspective, Proceedings of the IEEE, 69, pp. 1380–1419.

Marple, S. L. (1987), Digital Spektral [Spectral] Analysis. Chapter 11, pp. 303–315.

Brandenburg, K. & Johnston, J. D. (1990). Second Generation Perceptual Audio Coding: The Hybrid Coder. 88th AES Convention, Montreux, Preprint 2937.

Bisping, R. (1989). Steady Versus Impulsive Noise: Spectral Parameters and Subject Ratings. 13th International Congress on Acoustics. (vol. 3, pp. 143–146).

Berry, B. F. & Bisping, R. (1988). CEC Joint Project on Impulse Noise; Physical Quantification Methods, pp. 153–158.

Barrodale, I. & Erickson, R. E. (1980). Algorithms for Least Square Linear Prediction and Maximum Entropy Spectral Analysis-Part I & II, Geophysics, vol. 45, pp. 420–446.

Kumaresan, R. & Feng, Y. (1991). FIR Prefiltering Improves Prony's Method. IEEE Transactions on Signal Processing, vol. 39, pp. 736–741.

Bisping, R. & Malaka, J. (1990). Echzeitverarbeitung von Audiosignalen mit einem Transputer-Signalprozessor-Netzwerk. In: Bildungswerk des Verbandes Deutscher Tonmeister (Hrsg.), Bericht ueber die 16. Tonmeistertagung (pp. 138–145). [Real-time processing of audio signals with a transputer signal processor network. In: Educational Report of the Association of German Sound Engineers, Report on the 16th Sound Engineer Convention.].

(List continued on next page.)

Primary Examiner—Forester W. Isen
Attorney, Agent, or Firm—Sixbey, Friedman, Leedom & Ferguson

[57] ABSTRACT

A parametric method for remodelling audio signals in frequency range by which an improvement of the signal-to-noise ratio is possible, in particular for historical recordings. The process builds on spectral analysis that makes it possible to manipulate frequencies, bandwidths, and amplitudes of isolated spectral components in any way. For remodelling, those components are selected that 1) are relevant for acoustic perception and 2) can be classified as tonal because of their temporal stability. By enhancing the tonal portions relative to the noisy components (tonal contrast enhancement), according to the invention, substantial improvements of the acoustic quality are obtained while preserving the natural acoustic impression. With the help of parallel computer architecture based on transputer and signal processors, remodelling is performed within a period that appears acceptable for studio work.

19 Claims, 7 Drawing Sheets

OTHER PUBLICATIONS

Deutsch, W. A., Eckel, G. & Noll, A. (1992). The Perception of Audio Signals Reduced by Overmasking to the Most Prominent Spectral Amplitudes (Peaks). 92nd AES Convention, Vienna, Preprint 3331.

McAulay, R. J. & Quatieri, T. F. (1986). Speech Analysis/Synthesis Based on a Sinusoidal Representation, IEEE Transactions on Acoustics, Speech and Signal Processing, 34, 744–754.

Zwicker, E., & Fastl, H. (1990). Psychoacoustics. Chap. 6, Critical Bands and Excitation, pp. 133–154.

Lim, J. S., & Oppenheim, A. V. (1983). Enhancement and Bandwidth Compression of Noisy Speech, pp. 11–14.

Brigham, E. O. (1974). Fourier Series and Sampled Waveforms, pp. 75–77.

Rossing, T. H. (1989). The Science of Sound, Chapter 7.11–Effect of Phase on Timbre, pp. 160–162.

| NUMBER | CRITICAL BANDWIDTH [Hz] | NUMBER | CRITICAL BANDWIDTH [Hz] |
|---|---|---|---|
| 1 | 1–100 | 13 | 1720–2000 |
| 2 | 100–200 | 14 | 2000–2320 |
| 3 | 200–300 | 15 | 2320–2700 |
| 4 | 300–400 | 16 | 2700–3150 |
| 5 | 400–510 | 17 | 3150–3700 |
| 6 | 510–630 | 18 | 3700–4400 |
| 7 | 630–770 | 19 | 4400–5300 |
| 8 | 770–920 | 20 | 5300–6400 |
| 9 | 920–1080 | 21 | 6400–7700 |
| 10 | 1080–1270 | 22 | 7700–9500 |
| 11 | 1270–1480 | 23 | 9500–12000 |
| 12 | 1480–1720 | 24 | 12000–22050 |

FIG. 9

PROCESS FOR CONTROLLING THE SIGNAL-TO-NOISE RATIO IN NOISY SOUND RECORDINGS

BACKGROUND OF THE INVENTION

1. Field of the Invention

The invention relates to a process for automatically controlling the signal-to-noise ratio in noisy sound recordings.

2. Description of Related Art

It is known how to automatically reduce the background and/or modulation noises in historical and current-day recordings by controlling the signal-to-noise ratio of noisy sound recordings. It is also known that, with certain electronic or data processing procedures, on the one hand, spectral components based on a so-called masking spectrum can be selected, and on the other hand, tonal and noisy peaks can be differentiated based on an analysis of the frequency, amplitude and/or phase characteristic (see Deutsch Eckel Noll (1992) and Brandenburg/Johnson (1990) or McAulay/Quatieri (1986) in the appended bibliography). Once tonal and noisy peaks have been differentiated, then, the amplitude of the noisy peaks can be lowered relative to the amplitudes of the tonal peaks, thus, to improve the signal-to-noise ratio. Here, it is known to work with lowering of the amplitude by a basically constant amount, e.g., −10 dB. Further, it is known to divide the total band of audible frequencies into numerous partial bands and to lower each partial band individually, but always, again, by a constant amount in each case (equalizer principle).

SUMMARY OF THE INVENTION

The primary object of the invention is to provide a generic process by which a further improved control of the signal-to-noise ratio can be achieved.

In keeping with this primary object, is also an object of this invention to achieve a controlling of the signal-to-noise ratio that is more adapted to human hearing.

The a preferred embodiment of a process according to the invention is characterized by the following process steps:

a) peaks of the total audio signal are analyzed according to their frequency, amplitude and/or phase characteristic and, based on this, classified in a selection step into one of two classes, namely into the class of tonal peaks that are perceived by human hearing as sonorous and intentional, and into the class of noisy peaks that are perceived by human hearing as not sonorous and "distorting."

b) On a parallel course with process step a), an acoustic measured variable, i.e., loudness indicator, of the total audio signal is determined that is in a known relation to the loudness perception of human hearing.

c) The amplitudes of the noisy peaks are dynamically lowered relative to the amplitudes of the tonal peaks, in that the lower the loudness of the total audio signal, as indicated by the parallelly determined loudness indicator, the more the noisy peaks are lowered.

According to the invention, it has been recognized that a constant lowering, as exclusively performed previously in the prior art when controlling the signal-to-noise ratio of noisy sound recordings, is not perceived as optimal. In particular, loud passages with high amplitude peaks are perceived as too dull compared to the original tone since, at high signal levels of the total audio signal, human hearing expects a brighter acoustic pattern than at lower loudness. The solution of the above-explained acoustic problem makes the dynamic lowering, according to the invention, of the level of the peaks classified as noisy a function of the loudness of the total audio signal determined simultaneously for the respective peak.

As a loudness indicator, various measured variables common in acoustic metrology are suitable, e.g., loudness according to ISO 532 b (sone). The intensity level (in dB, dB(a), dB(b), etc), as such, is easier to handle metrologically than loudness and makes a simpler evaluation possible. The nonlinear, i.e., signal-dependent and, in particular, frequency-dependent, intensity perception of human hearing is taken into consideration in loudness, which therefore is preferred over intensity level as the control variable. Nevertheless, even when a normal intensity level is determined as the loudness indicator, a control of the signal-to-noise ratio results that is considerably better, because it is namely more naturally perceived, than with constant level lowering of the peak classified as noise, as in the prior art.

An essential aspect of the invention is a technique which is referred to herein as DTCE (dynamic tonal contrast enhancement), and which lowers the noisy portions of the total audio signal less in level when it is very loud than when it is not very loud. Thus, an extremely natural, bright acoustic pattern is achieved, especially also at loud passages, as desired.

A simplification of the evaluation technique results when the classification of the noisy peaks is performed by subtraction. That is, only one classification of tonal peaks is performed and all peaks not classified as tonal peaks are considered noisy peaks.

A further simplification, is obtained by the level lowering of step c) is made a linear function of the loudness indicator and is performed between fixed lower and upper limits, and the techniques suggested here are advantageous and completely sufficient in practice for computer evaluation.

DTCE is further optimized when the signal-to-noise ratio is improved not only by dynamically lowering the peaks, classified as noisy, in their amplitudes, but by simultaneously raising the amplitudes of the tonal peaks. That is, while in the first process step only the noise surface is dynamically lowered without impairing the tonal peaks, according to the above-explained process step, in addition, the tonal peaks are raised. This results in an enhancement of the harmonic components and especially of the overtones, which are likewise of essential importance for the overall acoustic pattern.

To raise the tonal peaks, raising by a constant amount is normally sufficient, in contrast to the case for lowering the noisy peaks. But, basically, it would also be possible to raise the tonal peaks dynamically. Then, for raising the level, corresponding considerations apply as in level lowering for the noisy peaks.

Besides, in this framework, distortions by tonal peaks that are too strong can also be eliminated purposely by lowering. This is then similar to the filter processes practiced in the prior art.

Also in the framework of the process according to the invention, it is recommended to divide the total band of audible frequencies into numerous partial bands and to perform the control of the signal-to-noise ratio according to the invention on each partial band separately. This is then very effective especially when the division into unevenly wide partial bands is performed according to the Bark ranges. For example, the audible frequency range between 1 and 22,000 Hz can be divided, according to Bark, into 24 partial bands (see Zwicker & Fastl (1990) in the bibliography) that correspond to the critical bands in Corti's organ of the human ear. By this division, the frequency selectivity of the human inner ear is imitated. A matching of the control of the signal-to-noise ratio, taking these partial bands into consideration, again results in a quite considerably naturally perceived control of the signal-to-noise ratio.

These and further objects, features and advantages of the present invention will become apparent from the following description when taken in connection with the accompanying drawings which, for purposes of illustration only, show several embodiments in accordance with the present invention.

BRIEF DESCRIPTION OF THE DRAWINGS

FIG. 9 is a table providing an overview of the Bark bandwidth ranges separated in the process according to the invention in the preferred embodiment;

DETAILED DESCRIPTION OF THE PREFERRED EMBODIMENT

Figure 1:
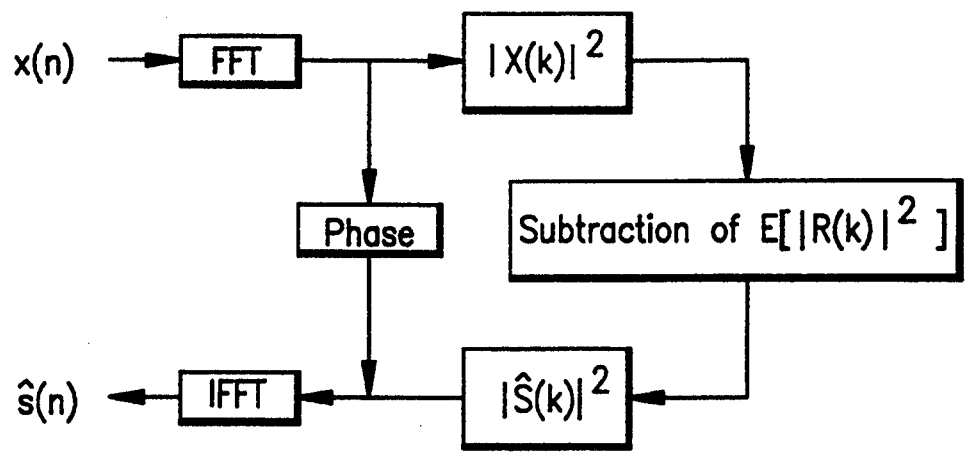
FIG. 1 is a block diagram depicting a spectral subtraction calculation path.

To better reconstruct the background of the process according to the invention, the following explains the context in which control of the signal-to-noise ratio in noisy sound recordings has special significance and the procedures that can be used for it and that are used according to the teaching of the invention. Remodelling of historical recordings takes on special significance here, and it is becoming increasingly significant. With the help of a wide variety of computer programs, a sound recording is taken apart, reduced into essential core components to save computer expense, and then again reassembled so that, in the end, a considerably improved acoustic pattern results that comes considerably closer to the original piece of music on which the sound recording is based.

Current, commercially available processes to reduce the noise level ("denoising") in music-and voice recordings are based essentially on the methods of spectral subtraction (see Lim & Oppenheim, 1983). The process is based on the consideration that noisy time function x(n) consists cumulatively of a desired, noise-free signal portion s(n) and a noise portion r(n):

$$x(n) = s(n) + r(n).$$

Under the assumption that s(n) and r(n) are uncorrelated, the calculation of the power spectrum results with the help of FFT:

$$|X(k)|^2 = |S(k)|^2 + |R(k)|^2$$

in which:

$$X(k) = \sum_{n=0}^{N-1} x(n)e^{(-j2\pi nk/N)}$$

N = number of signal values
k = ordinal number of frequencies: 0, 1 ..., N−1
n = ordinal number of signal values: 0,1 ..., N−1
$\pi$ = circular number
j = imaginary number.

X(k) is a complex number of the form $a(k) \pm j\, b(k)$. The coefficients a(k) and b(k) are designated as Fourier coefficients (see Brigham, 1976).

The square of X(k) is the spectral power:

$$|X(k)|^2 = a(k)^2 + b(k)^2.$$

The amplitude of X(k) is:

$$|X(k)| = \sqrt{a(k)^2 + b(k)^2}.$$

The phase is calculated by:

$$\phi(k) = \tan^{-1}(b(k)/a(k))$$

By inverse transformation in the time domain with the inverse Fourier transform (IFFT), the original time function is reconstructed. The IFFT obeys the following algorithm:

$$x(n) = 1/N \sum_{n=0}^{N-1} X(k)e^{(j2\pi nk/N)}$$

The theoretical assumption that signal and noise act cumulatively toward one another implies that signal and noise are linear processes, i.e., independent of one another. But, this assumption does not apply, e.g., to modulation noises, since here the distortion level is a function of the signal level, and thus, nonlinear conditions are present.

The estimation of the noise spectrum is performed in the spectral subtraction method by determining an average noise spectrum by evaluating signal-free sections of the music recording, e.g., at the beginning or end of the recording. This leads to the following statement:

$$|X(k)|^2 = |S(k)|^2 + E[|R(k)|^2],$$

in which $E[|R(k)|^2]$ represents the expected value of the noise spectrum.

With this method, it is assumed that the determination of the average noise spectrum on the basis of available noise passages (usually time sequences of less than one second in length) in fact makes it possible to assess the expected value of the noise spectrum (the so-called "true" noise spectrum). Further, it is assumed that the estimated expected value is representative for the individual noise spectrum at any point in time. But in practice, these assumptions are not always fulfilled, since the static properties of noise can change during a recording.

An estimation of the desired signal spectrum is performed by subtraction of the expected value of the noise spectrum from the original spectrum:

$$|\hat{S}(k)|^2 = |X(k)|^2 - E[|R(k)|^2].$$

Generally, it can be written:

$$|\hat{S}(k)|^a = |X(k)|^a - bE[|R(k)|^q]$$

If it is set that $a=2$ and $b=1$, this corresponds to the method according to FIG. 1. By weighting the noise spectrum with b, the degree of denoising can be determined by the user. By inverse transformation in the time domain, the original phase is maintained, i.e., the phase undergoes no further manipulation. This corresponds to the observation that phase is of only secondary importance for the perception of tone by the human ear (von Helmholtz, 1863; Plomb, 1970; see Rossing, 1989).

The considerations above show that the spectral subtraction method takes into consideration only global and temporally invariant signal properties (see Lim & Oppenheim, 1983). This means, for the practical application of this process, that only stationary background noises can be reduced, and thus, the signal-to-noise ratio can be improved overall only within certain limits. Too great a noise reduction easily leads to tonal artifacts or to acoustic degradation of the overall result, as soon as the acoustic signal properties change by temporal fluctuations (see Goeres-Petry & Dell, 1990; Houpert, 1991). Disruptive influences such as modulation noises or harmonic distortions cannot be eliminated with this method, since handling them requires interfering in the spectral structure of the signal. For this reason, the attempt at remodelling isolated components of the spectrum was chosen. Among the processes described in the literature, Prony spectral analysis offers especially extensive possibilities for this (see Kay & Marple, 1981; Marple, 1987).

The selection of the spectral components to be modelled represents a critical problem. This is performed in two steps. In the first step, on the basis of a FFT spectrum, a masking spectrum is calculated and only those components are selected that lie above the masking threshold. The essential purpose of this measure is to reduce the spectral components so as to take into consideration, during subsequent remodelling, only the audible components. In the second step, the temporal behavior of the selected components is analyzed, to be able to distinguish tonal from non-tonal components. During subsequent remodelling of the spectrum, the tonal portions are then enhanced compared to the noise portions (tonal contrast enhancement).

I. Selection of Spectral Components

A. Selection Based on Masking Effects

Masking means that certain sounds are no longer perceived by the ear because of the presence of other sounds; although, in level, they are above the threshold of audibility. If the frequency of a soft sound lies in the vicinity of a loud sound, it is swamped by the latter, since the masking threshold in this frequency range is raised above the level of the soft sound. In addition to simultaneous swamping in the case of isochronous sounds, in psychoacoustics pre- and post-swamping are further differentiated, depending on whether the masking (loud) sound lies temporally before or after the masked (soft) sound (see Zwicker & Fastl, 1990).

In calculating masking thresholds, the audible frequency range is divided into 24 partial bands that correspond to the critical bands in Corti's organ. Thus, the frequency selectivity of the inner ear is imitated. The critical bandwidths are also called frequency groups. Their unit of measurement is a Bark. Below 500 Hz, the width of one frequency group is constantly 100 Hz, above 500 Hz its width grows with increasing frequency and is, on the average, about 20% of its respective mid-frequency. For calculating the masking thresholds, it is further significant that pure sounds, when heard, swamp pure sounds that are adjacent in frequency to a lesser extent than do noise bands with the same mid-frequency. A wanted signal consequently swamps noise much more efficiently than a pure sound. If the level within a critical bandwidth is known and if it is further known, whether a tonal or a noisy process is involved, an inference can be made from it as to the masking threshold for the pertinent critical bandwidth. A description of the calculation method is in Johnston (1988).

Figure 2:
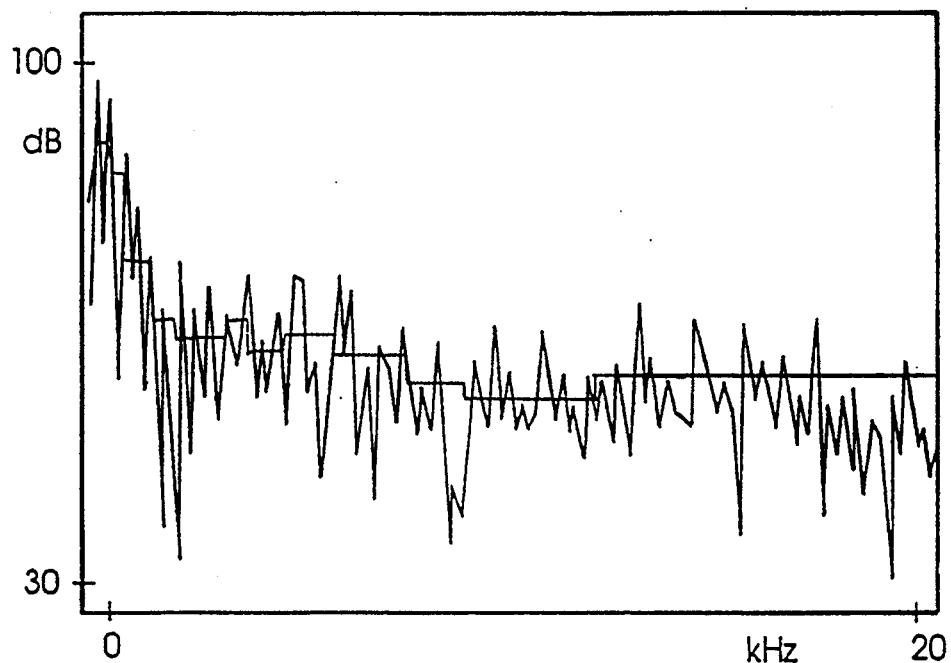
FIG. 2 graphically depicts the spectrum of an audio signal with a masking spectrum superimposed on it.

FIG. 2 shows that a portion of the spectral components lies below the masking threshold. The portion, in percent, of these disregarded components is an average of about 70-80%. A more extensive possibility of reduction lies in calculating an overmasking spectrum, in which the masking thresholds are weighted within the critical bandwidths to be able to exclude also nonmasking interfering components (see Deutsch, Eckel and Noll, 1992). But still, an unsolved problem here is the establishment of criteria to control the degree of overmasking.

Selection Based on Temporal Stability

In their frequency, amplitudes, and phase characteristic, tonal components act in a more stable way temporally than noisy components (considerably shorter decay times). This can be exploited for determining tonality. Brandenburg & Johnston (1990) propose a temporal predictor that originates in combined amplitudes and phase information. The method of McAulay & Quatieri (1986) offers another possibility involving the temporal relationship of spectral components with the help of a "peak-matching" technique. Noisy components prove here to be considerably more short-lived than tonal components. The method is comparatively computer-intensive but, based on comparative analyses in our laboratory, has proven robust and reliable.

Remodelling of Spectral Components

Prony's method (de Prony, 1795) assumes that any time function $x_n$ can be expressed by a sum of exponentially damped time functions:

$$X(k) = \sum_{n=0}^{N-1} b_m z_m^n; \; n = 0, 1, 2 \ldots, N-1$$

$b_m = A_m \exp(j\theta_m)$
$z_m = \exp((\pi\alpha_m + j2\pi f_m)T)$
$A_m = |b_m|$ is the amplitude
$\theta_m = \tan^{-1}(\mathrm{lm}(b_m)/\mathrm{Re}(b_m))$ is the phase
$\alpha_m = |z_m|$ is the bandwidth
$f_m = \tan^{-1}(\mathrm{lm}(z_m)/\mathrm{Re}(z_m))/2\pi T$ is the frequency
T=is the sampling period.

Other than the Fourier Transform, whose estimation by FFT makes it possible only to determine the amplitude and phase of a spectral component, here additionally, the bandwidth and frequency of a component were calculated. These parameters can be determined in the FFT spectrum only in an indirect way and only imprecisely. The bandwidth determines the degree of exponential damping of the signal in the dme domain, and thus, the degree of impulse adhesiveness of an acoustic event; wide peaks tend to be greatly exponentially damped, i.e., impulsed time functions, narrow peaks correspond in the time domain to sinusoidal signals. There is a close statistical relationship between the subjective estimate of the impulse adhesiveness of a signal and the degree of spectral spread (Bisping, 1989, Berry and Bisping, 1988).

The determination of the four Prony parameters is numerically a nonlinear problem (Hildebrand, 1956) that, however, can be linearized as follows (see Marple, 1987): Time function $x_n$ is conceived in a first step as an autoregressive process of order P:

$$X(k) = -\sum_{m=1}^{p} a_m x_{n-m} + e_n; \; n = 0, 1, 2 \ldots, N-1$$

$a_m$; m=1, 2 ..., p are the autoregressive filter coefficients
$e_n$; n=0, 1, 2 ..., N−1 is the error function.

A series of efficient processes is available to calculate the filter coefficients. A robust estimation process is the maximum entropy method of Barrodale & Erickson (1980). In the second step, the complex zero positions of filter polynomial $a_m$, m=0, 1, ..., p, $a_0$ =1; are determined. This leads to the determination of the frequency and bandwidth by evaluation of complex zero position $z_i = \mathrm{Re}(z_i) + j\,\mathrm{lm}(z_i)$ in the z-plane. In the third step, a discrete Fourier Transform CDFT) is performed to determine the amplitudes and phases at those frequencies that were determined in the second step. The Prony amplitude spectrum is calculated as follows:

$$\hat{P}(i) = \sum_{m=1}^{p} A_m \frac{\alpha_m^2}{(\alpha_m^2 + (2\pi(f - f_m))^2)}$$

The formula shows that by knowing the bandwidths, amplitudes and frequencies, a complete remodelling of the amplitude spectrum is possible. By changing the parameters based on certain givens, e.g., weighting of the bandwidths, extensive manipulations of the spectrum and thus of the timbre are thus possible.

It is known that the numerical stability of the Prony method closely depends on the signal-to-noise ratio of the signal, i.e., at low signal-to-noise ratio there is the danger of spectral artifacts occurring. Kumaresan & Feng (1991) propose, for this reason, to couple the Prony method with an incremental bandpass filtering by a Hamming weighting, to emphasize prominent signal portions relative to noise portions before calculating the Prony parameters. Systematic analyses in our laboratory showed that this process clearly improves the reliability of the Prony method.

Figure 3:
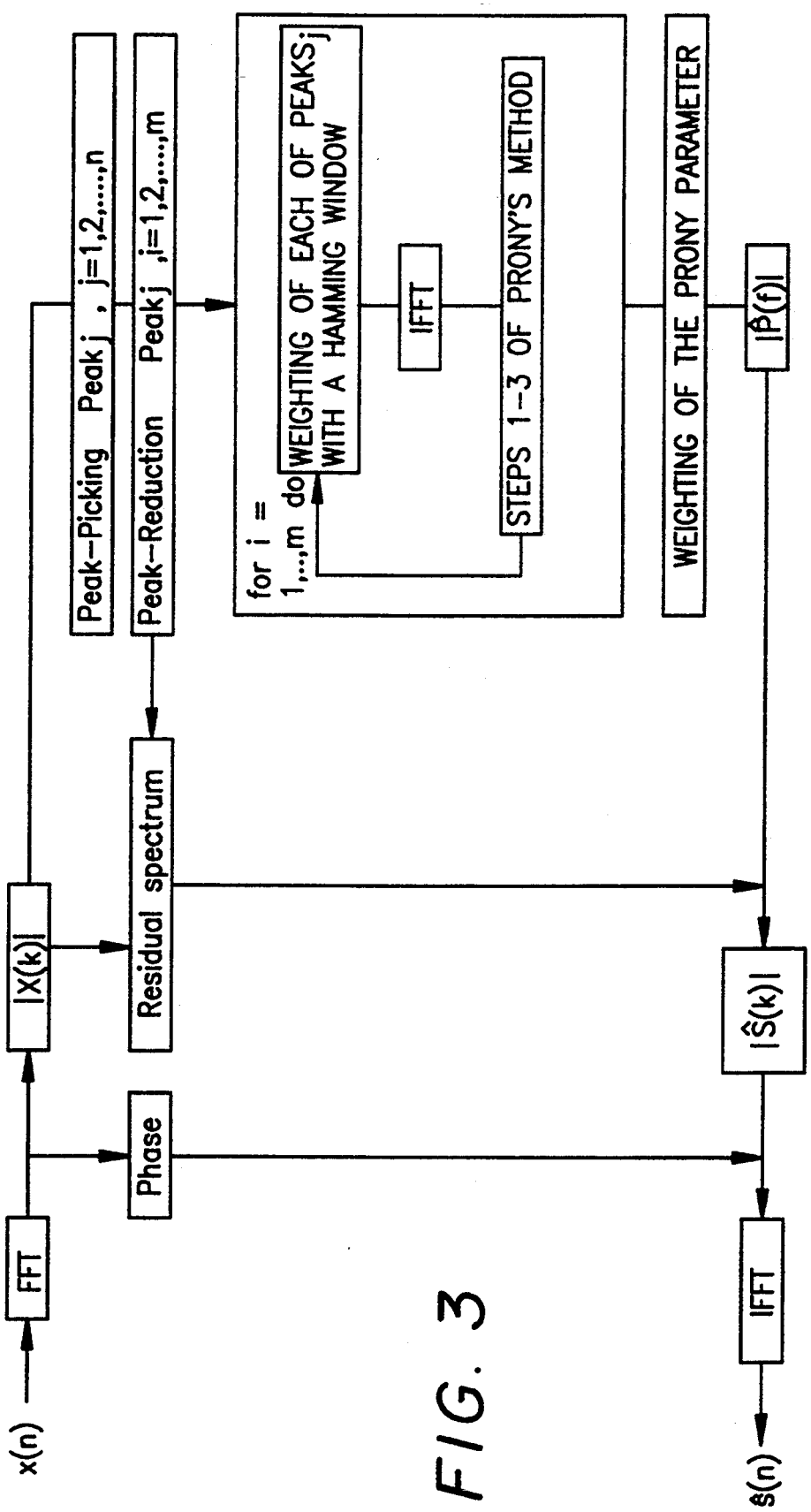
FIG. 3 is a flow diagram of a spectral remodelling process utilized in accordance with the present invention.

FIG. 3 diagrammatically summarizes the remodelling process based on the above considerations. In particular, this figure shows that, after isolating the tonal peaks from the spectrum, a remodelling of each individual peak is performed by filtering and Prony analysis. Depending on the target concept, the frequencies, bandwidths or levels can be manipulated individually. By frequency variation, e.g., "pitch shifting" effects can be achieved. By changing the bandwidths, the acoustic impression with respect to the degree of impulse adhesiveness can be influenced. By lowering the level, harmonic distortions can be reduced (but this presupposes knowledge of the base frequency and of the harmonic structure of the signal). By raising the level, the tonal components are enhanced relative to the noisy components (tonal contrast enhancement). In this way, not only is a suppression of the wideband background noise achieved, but also of the local modulation noise. It is true that this is associated in frequency and level with the tonal peaks because of its nonlinear composition, but it is suppressed by the remodelling of a peak. After establishing the weighted Prony spectrum, it is combined with the residual portions of the spectrum that have remained unprocessed and the overall level is lowered by the amount by which the tonal portions are raised. This results in a new assessment of the spectrum. While retaining the original phase, the signal is finally transformed back into the time domain.

Implementation of Algorithm on a Transputer Signal Process Network

The algorithm described up to now reaches considerably further in its possibilities of manipulation, theoretical as well as tested practically in the laboratory, than conventional, linear processes. But, the computational expense is high and can no longer be managed in practice with common audio workstations. For this reason, a parallel computer based on transputer and signal processors was developed by S.A.S. Systems with which a remodeling of audio signals with studio quality can be performed within an acceptable period (Bisping & Malaka, 1990). By coupling the signal processor and transputer, two goals were achieved simultaneously: a) the signal processor is responsible for the necessary computing speed and b) the transputer makes it possible to expand the system by adding to it, depending on need (cumulative expandability is a big problem with conventional computer configurations, e.g., baised on PC's and is generally not easily possible).

Figure 4:
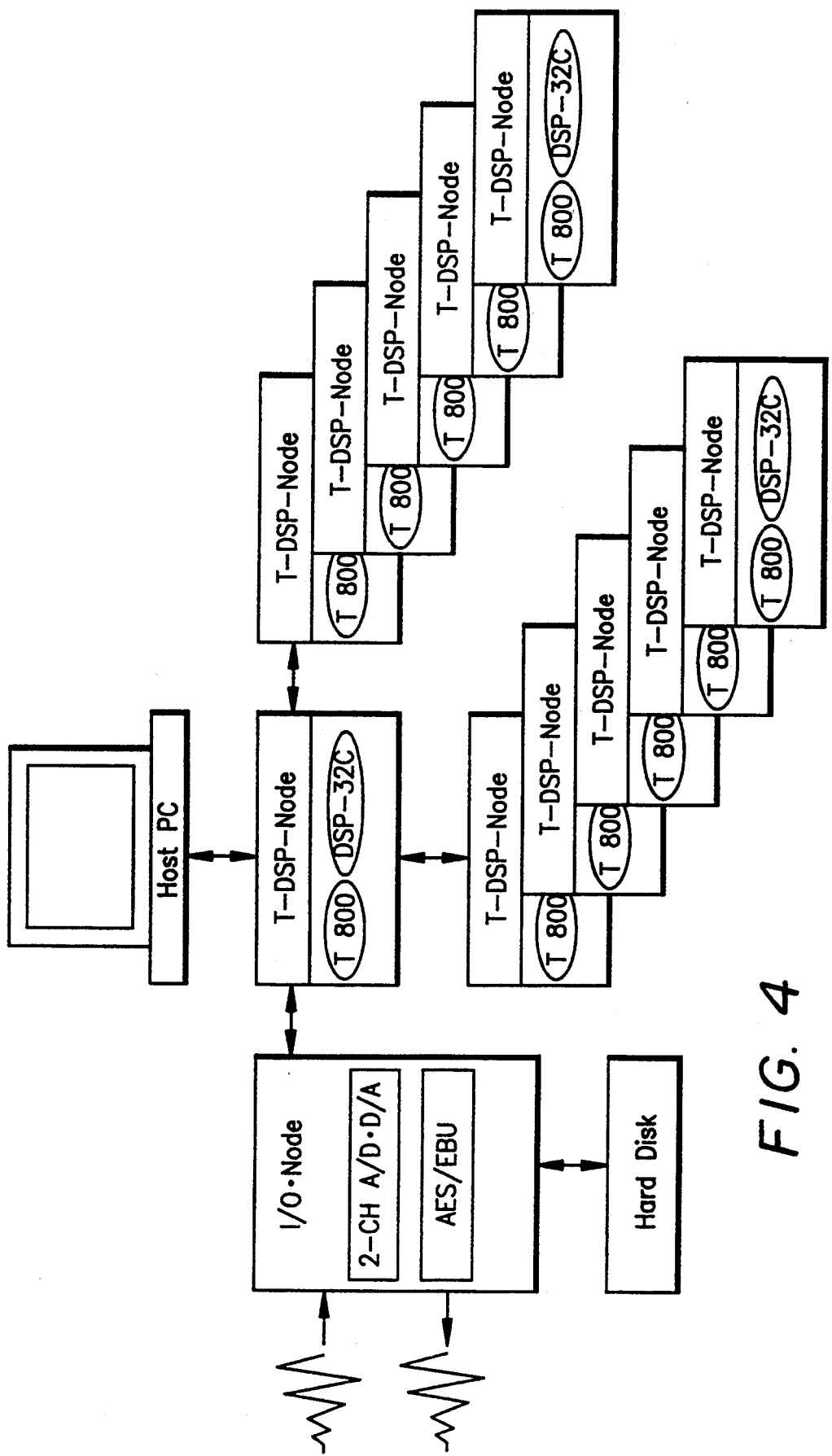
FIG. 4 is a diagrammatic depiction of a computer performing remodelling of audio signals on a parallel basis.

FIG. 4 shows a diagram of parallel computer system. Audio signals that are fed via analog band or DAT recorder into the system (sampling rate 44.1 kHz, 16 bits) are first stored on hard disk. The supply of audio data to the system is performed with an I/O processor (I/O node), likewise based on the transputer, that can be connected in series to other I/O processors into networks as large as desired. For the calculations, the signal is transferred into the network of transputer-signal processor nodes (T-DSP node) of the I/O processor. Control of the data traffic and the T-DSP network is performed by a T-DSP master node. It also establishes the connection with the host computer (IBM PC), on which the graphic operating surface is located. Both chains running to the right or below the T-DSP master node are T-DSP nodes and are each responsible for both stereo channels.

Results

Figure 5A:
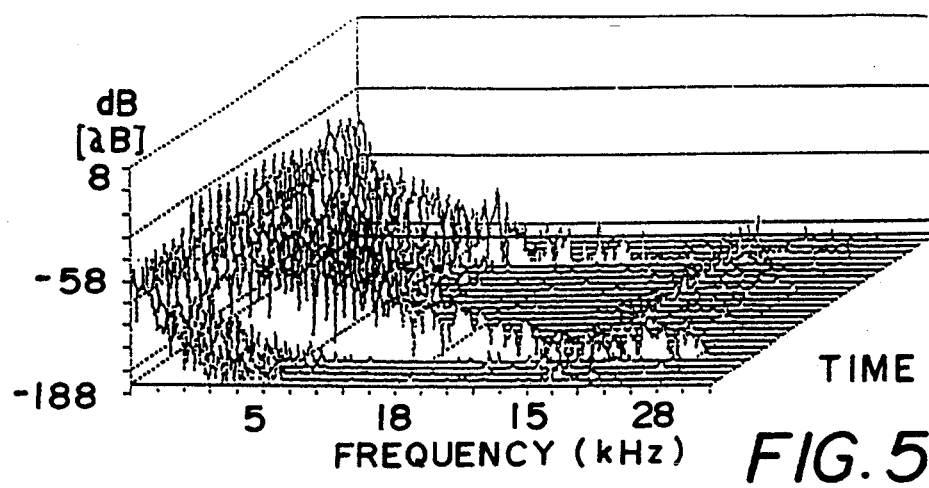
FIGS. 5a & 5b three-dimensionally show the amplitude spectrum of two strums on a guitar, with FIG. 5a being the noisy original FIG. 5b being after remodelling.
Figure 5B:
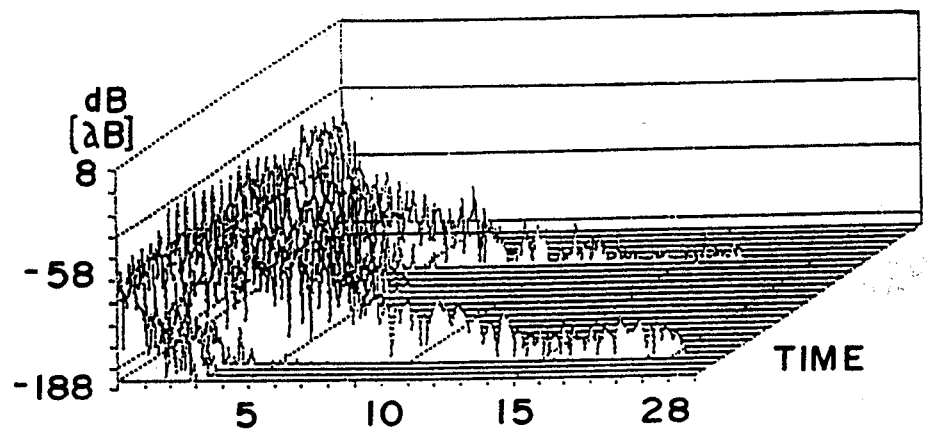
Figure 6A:
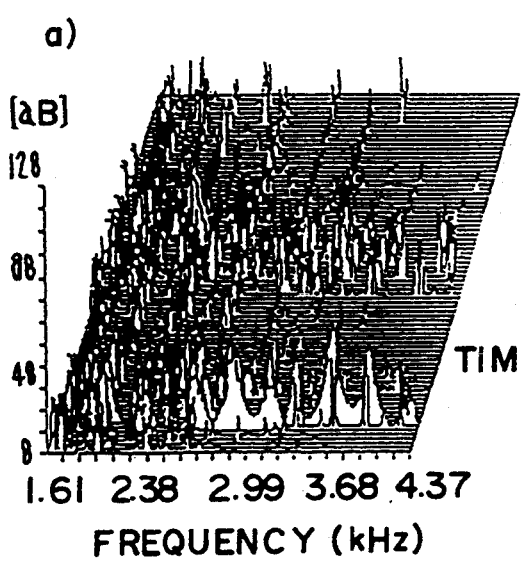
FIGS. 6a and 6b depict amplitude spectra corresponding to those of FIGS. 5a & 5b in the frequency range of 1.6–4.4 kHz, but achieved without use of a Fourier transform.
Figure 6B:
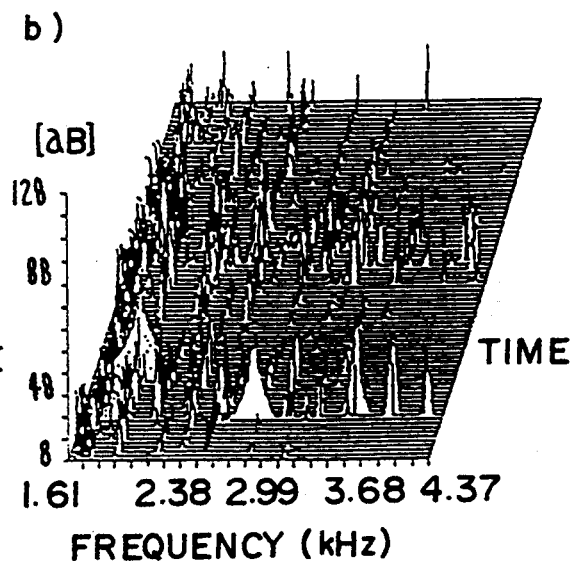

Results with the described technique already exist for the problem of noise reduction in historical recordings; FIG. 5a shows a 3-D FFT amplitude spectrum of a noisy passage of a guitar solo. FIG. 5b shows the same passage after successful remodelling. FIGS. 6a & b show a 3-D zoom Prony amplitude spectrum of passages corresponding to those in FIG. 5a & b for the frequency range between 1.6 and 4.4 kHz. These figures make it clear that not only was the spectral structure of the guitar tone fully maintained over the entire spectral range, but also a substantial reduction of the noise portions occurred. The computing times needed for the results shown were in a 1:7 ratio with real time.

Essential for the invention is a process for automatically controlling the signal-to-noise ratio in noisy sound recordings, characterized by the following process steps:

a) The peaks of the total audio signal are analyzed according to their frequency, amplitude and/or phase characteristic and, based on this, the peaks are classified, in a selection step, into one of two classes, namely into the class of tonal peaks that are perceived by human hearing as sonorous and intentional, and into the class of noisy peaks that are perceived by human hearing as not sonorous and "distorting."

b) On a parallel course with process step a), an acoustic measured variable, e.g., loudness indicator, of the total audio signal is determined that has a known relation to the loudness perception of human hearing.

c) The amplitudes of the noisy peaks are dynamically lowered relative to the amplitudes of the tonal peaks, namely, the lower the loudness of the total audio signal as indicated by the parallelly determined loudness indicator, the more the noisy peaks are lowered.

Figure 7:
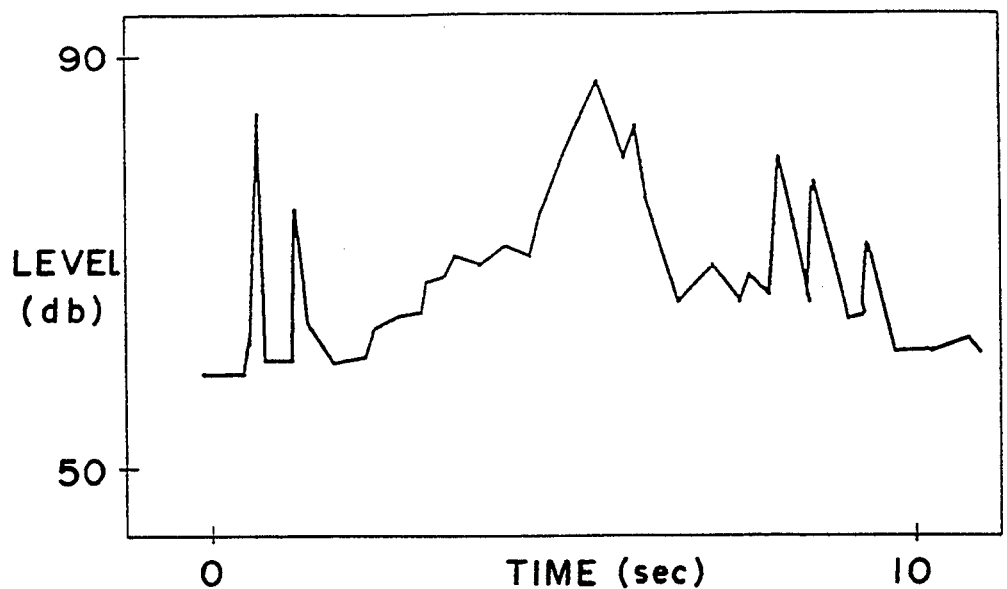
FIG. 7 is graphic depiction of the temporal characteristic of the loudness indicator "level"0 above 3 kHz of a music passage.

FIG. 7 shows the temporal characteristic of a loudness indicator, here the RMS level, above 3 kHz in a passage of, e.g., rock music. The total sound signal, as has been explained in detail, is classified according to tonal and noisy peaks. The characteristic of the loudness indicator determined in process step b), FIG. 7, is now used in process step c) to dynamically achieve a level lowering of the noisy peak.

Figure 8:
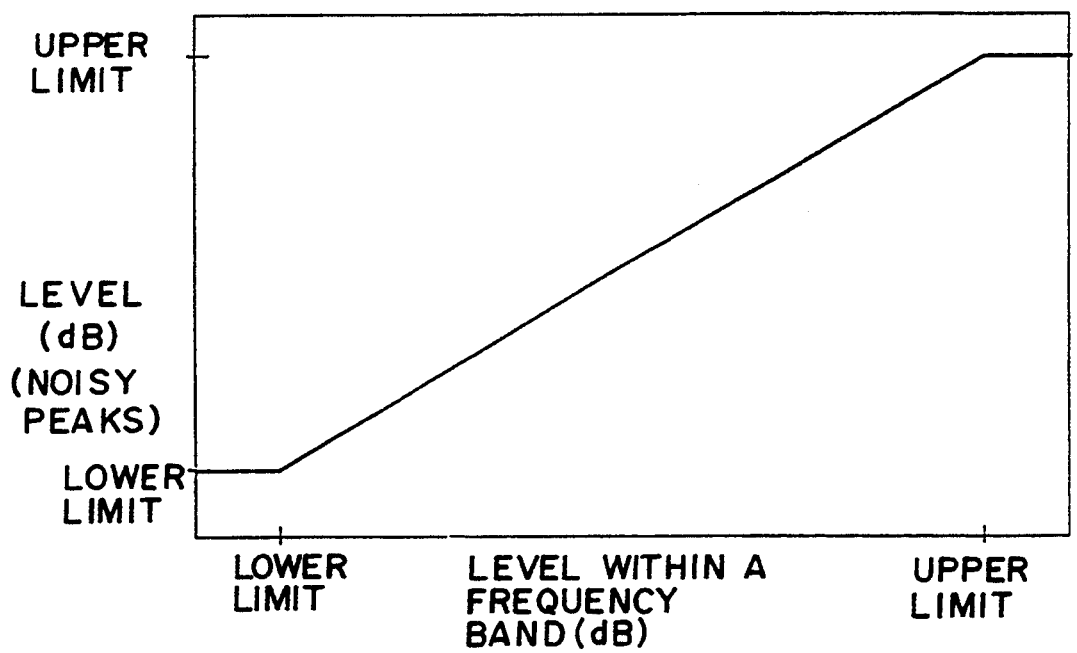
FIG. 8 shows a preferred characteristic curve for lowering the level of peaks classified as noisy as a function of the loudness indicator (level) within a frequency band for the total audio signal.

FIG. 8 shows the characteristic curve for the level lowering of noisy components as a function of level, here represented by the loudness indicator "level," (or gain) within a frequency band. It can be seen that the level lowering is considerably less for loud passages (right in illustration 8), namely is "zero" in the extreme case, than for soft passages (left in illustration 8). For example, the lower limit could be set at −12 dB and the upper limit at 0 dB. But basically, any upper and lower limit of level lowering can be established by the user, which can suit his personal music perception especially well.

FIG. 8 shows level lowering as a linear function of loudness indicator, nonlinear characteristics are also possible here.

The effect of the process according to the invention for the listener consists in that soft music passages, in which noise has an especially disruptive effect, are more greatly denoised than loud music passages, in which noise is not so disruptive because of the masking properties of human hearing. The noise reduction process described thus intervenes in the signal structure only where it is absolutely necessary. Where it is not absolutely necessary, the noise reduction process according to the invention does not intervene. Thus, undesired acoustic distortions that cannot be prevented in loud passages, in particular the impression of missing pitches (too dull an acoustic pattern), are prevented. Educated listeners perceive the effect of the control of the signal-to-noise ratio according to the invention directly as particularly pleasing.

FIG. 9 shows an overview of the 24 partial frequency bands (Bark ranges) formed in the process according to the invention in this embodiment, which have been explained above already in their significance for imitating the frequency selectivity of the inner ear. On this point, the explanations with respect to the selection of spectral components based on masking effects, at pages 10–11 above, are noted, in particular.

Figure 10:
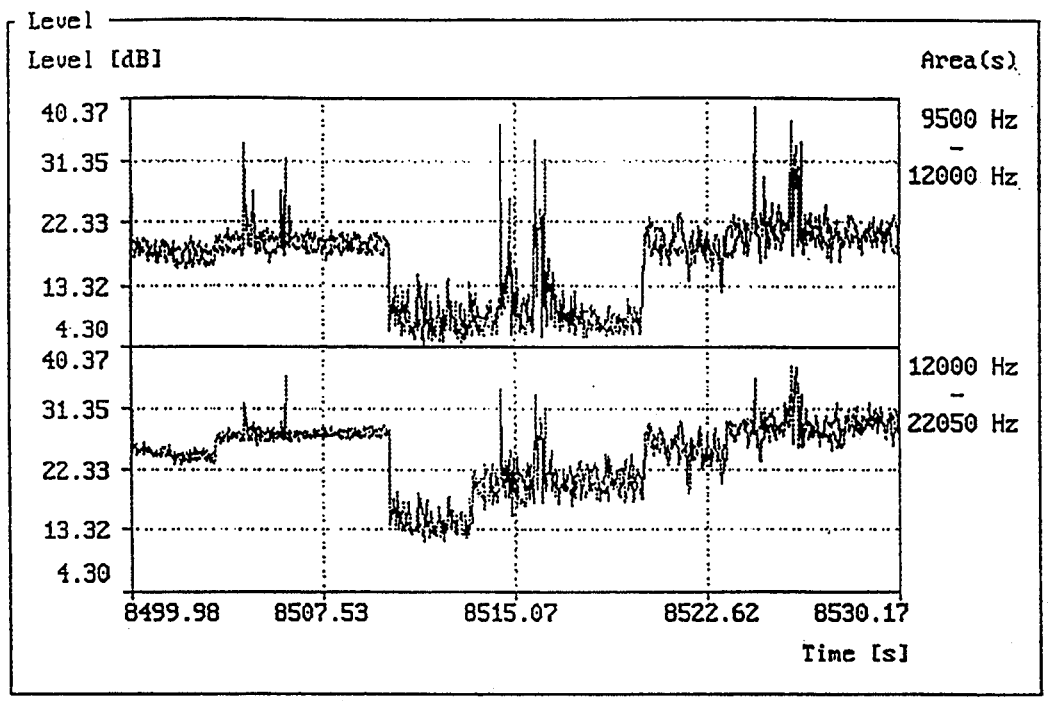
FIG. 10 is a plot of the temporal characteristic of the loudness indicator "intensity level" in two selected, especially noise-sensitive Bark bandwidth ranges in three control stages.
Figure 11:
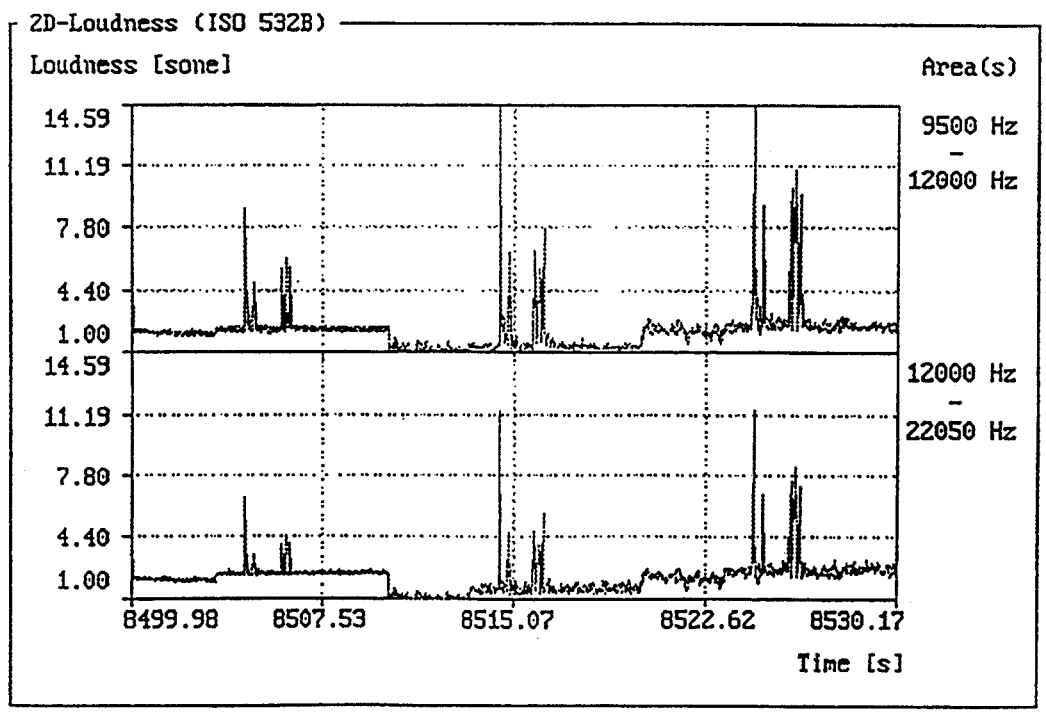
FIG. 11 is a representation, corresponding to that of FIG. 10, showing the corresponding temporal characteristic of the loudness indicator "loudness."

Based on FIGS. 10 and 11, a more preferred configuration of the process according to the invention will now be explained from various viewpoints with respect to the loudness indicator. FIGS. 10 and 11 show one and the same part of a piece of music in two relatively high-frequency Bark ranges that are particularly sensitive to noise influences. FIG. 10 has, as loudness indicator for the total sound signal, the simple physical intensity level (measured variable, decibel, dB), while FIG. 11 analyzes the same piece of music as perceived by human hearing, namely with a loudness indicator of "loudness" according to ISO 532 B.

In both figures, a first music passage is seen that has not been processed at all with the process according to the invention (in time interval of 8,499.98 to 8,510.04 seconds). After that, there is a second part of the illustrated passage (the time interval of 8,510.04 to 8,520.11 seconds) in which only the basic process according to invention was used. That is, only the noise level was dynamically lowered according to the process of the invention, and it can be seen that the tonal components were not, or practically not, influenced in their amplitude (guitar strums are involved here). In the third part of the illustrated passage (between 8,520.11 and 8,530.17 seconds), tonal contrast enhancement by raising the amplitudes of the tonal peaks was added, and specifically, here, by a constant amount. In this way, on the one hand, the tonal peaks that define the guitar strums are enhanced, on the other hand, the harmonic components are enhanced in the main tonal field, and above all, new overtones are produced and added to the spectrum. In this way, from the illustrations it can be concluded that, apparently, a raising of the noise level has occurred. But, this impression is incorrect, the reason for the apparent raising of the noise level lying solely in the overall higher energy in the total sound signal, which, however, stems primarily from the higher energy values of the tonal components.

The same characteristic, in principle, can be seen from the loudness characteristic in FIG. 11, and there the tonal peaks are emphasized more clearly out of the noise surface.

If, instead of a raising of the tonal peaks by a constant amount, as here, a dynamic raising were to be performed so that the greater the loudness of the total sound signal as indicated by the loudness indicator, the greater the raising of the tonal peaks, then a characteristic curve similar to FIG. 8 would be suitable, and then the level values on the ordinate would not be lowered, but rather raised.

The judgment of the effect of the DTCE process can be made especially well with a combined analysis from the loudness indicator "intensity level" and the loudness indicator "loudness."

Especially in combination with a remodelling process, the process according to the invention has great significance for controlling the signal-to-noise ratio. By the process according to the invention, unusual effects can be achieved that give a historical recording the character of a new production by reducing the background and modulation noises.

While various embodiments in accordance with the present invention have been shown and described, it is understood that the invention is not limited thereto, and is susceptible to numerous changes and modifications as known to those skilled in the art. Therefore, this invention is not limited to the details shown and described herein, and includes all such changes and modifications as are encompassed by the scope of the appended claims.

Bibliography

Aures, W. (1984) Berechnungsverfahren fuer den Wohlklang beliebiger Schallsignale. Ein Beltrag zur gehoerbezogenen Schallanalyses. Unveroefentol. Dissertation am Institute for Electroakustik der Techn. Universitaet Muenchen. [Calculation process for melodiousness of any acoustic signal. An article on acoustic analysis with respect to hearing. Unpublished dissertation at the Institute for Electroacoustics of the Technical University of Munich].

Barrodale, I., & Erickson, R. E. (1980). Algorithms for Least Square Linear Prediction and Maximum Entropy Spectral Analysis—Part I & II, Geophysics, 45, 420–446.

Berry, B. F., & Bisping, R. (1988). CEC Joint Project on Impulse Noise; Physical Quantification Methods., In: Berglund, B., Berglund, U., Karlsson, J., & Lindvail, T. (Eds.), Noise as a Public Health Problem (Vol. 3, pp 153–158). Stockholm: Swedish Council of Building Research. Bisping, R. (1989). Steady Versus Impulsive Noise: Spectral Parameters and Subjective Ratings. In: Pravica, P., Drakuluc, G. & Totic, B. (Eds.), 13th International Congress on Acoustics (Vol. 3, pp. 143–146). Sabac: Dragan Smic Press.

Bisping, R., & Malaka, J. (1990). Echtzeitverarbeitung von Audiosignalen mit einem Transputer-Signalprozessor-Netzwerk. In: Bildungswerk des Verbandes Deutscher Tonmeister (Hrsg.), Bericht ueber die 16. Tonmeistertagung (pp. 138–145). Muenchen etc.: Verlag K.G. Saur. [Real-time processing of audio signals with a transputer signal processor network. In: Educational Report of the Association of German Sound Engineers (Eds.), Report on the 16th Sound Engineer Convention. Munich, etc., K.G. Saur Publisher.]

Brandenburg, K., & Johnston, J. D. (1990). Second Generation Perceptual Audio Coding: The Hybrid Coder. 88th AES Convention, Montreux, Preprint 2937.

Brigham, E. O. (1974). The Fast Fourier Transform. London etc.: Prentice-Hall.

Deutsch, W. A., Eckel, G., & Noll, A. (1992). The Perception of Audio Signals Reduced by Overmasking to the Most Prominent Spectral Amplitudes (Peaks). 92nd AES Convention, Vienna, Preprint 3331.

Goeres-Petry, J. & Dell, J. (1990). Erfahrungen der Ueberarbeitung von Archivmaterial unter Einsatz von "Denoise," "Declick," und "Decrackle." In: Bildungswerk des Verbands Deutscher Tonmeister (Hrsg.). Muenchen: Verlag K.G. Saur. [Experiments in reworking archival material using "denoise," "declick," and "decrackle." In: Educational Report of the Association of German Sound Engineers (Eds.). Munich: K.G. Saur Publisher.]

Helmholtz, H. L. F. von (1863). Die Lehre von den Tonempfindungen als physiologische Grundlage fur die Theorie der Musik. Braunschweig: F. Vieweg Verlag. [The Teaching of Sound Perceptions as Physiological Basis for Music Theory. Braunschweig: F. Vieweg Publisher.] Hildebrand, F. B. (1956). Introduction to Numerical Analysis. New York: McGraw-Hill.

Houpert, J. (1991). NoNoise von [of]Sonic Solution. Production Partner, 3, 30–35.

Johnston, J. D. (1988). Transform Coding of Audio Signals Using Perceptual Noise Criteria. IEEE Journal on Selected Areas in Communication, 6, 314–323.

Kay, S. M., & Marple, S. L. (1981). Spectrum Analysis—a Modern Perspective. Proceedings of the IEEE, 69, 1380–1419.

Kumaresan, R., & Feng, Y. (1991). FIR Prefiltering Improves Prony's Method. IEEE Transactions on Signal Processing, 39, 736–741.

McAulay, R. J., & Quatieri, T. F., (1986). Speech Analysis/Synthesis Based on a Sinusoidal Representation, IEEE Transactions on Acoustics. Speech and Signal Processing, 34, 744–754.

Lim, J. S., & Oppenheim, A. V. (1983). Enhancement and Bandwidth Compression of Noisy Speech. In: J. S. Lira (Ed.), Speech Enhancement. Englewood Cliffs: Prentice Hall.

Marple, S. L. (1987). Digital Spektral [Spectral] Analysis. Englewood Cliffs: Prentice Hall.

Plomp, R. (1970). Timbre as a Multidimensional Attribute of Complex Tones. In: R. Plomp & G. Smoorenburg (Eds.), Frequency Analysis and Periodicity Detection in Hearing. Leiden: Sijthoff.

deProny, Baron, G. R. (1795). Essai experimental et analytique: sur les lois de la dilatabilite des fluides elastiques et sur celles de la force expansive de la vapeur de l'eau et d la vapeur de l'alkool a different temperatures. Journal de L'Ecole Polytechnique, 1, 24–76. [Experimental and analytic test: on the laws of dilatability of elastic fluids and on those of the expansive force of water and alcohol vapor at various temperatures. Journal of the Polytechnical University.]

Rossing T. H. (1989). The Science of Sound. Reading etc.: Addison-Wesley Publishing Company.

Zwicker, E., & Fastl, H. (1990). Psychoacoustics. Berlin etc.: Springer.

I claim:

1. Process for automatically controlling the signal-to-noise ratio of noisy sound recordings, comprising the following steps:
   a) analyzing the peaks of a total audio signal according to at least one frequency, amplitude and phase characteristics and based on the results of the analysis, classifying the peaks as being either tonal peaks that are perceived by human hearing as sonorous and intentional, or noisy peaks that are perceived by human hearing as being distorted and not sonorous;
   b) On a parallel course with step a), measuring an acoustic variable of the total audio signal which has a known relation to the loudness perception of human hearing and designating it as a loudness indicator;

c) Dynamically lowering the amplitudes of the noisy peaks relative to the amplitudes of the tonal peaks in a manner such that the lower the loudness of the total audio signal as indicated by the loudness indicator, the more the amplitudes of the noisy peaks are lowered.

2. Process according to claim 1, wherein the classification in step a) is performed by subtraction, in that only those peaks falling into the classification of tonal peaks are identified, and all peaks not identified as being tonal peaks are treated as noisy peaks.

3. Process according to claim 1, wherein the level lowering according to process step c) is a linear function of the loudness indicator.

4. Process according to one of claim 3, wherein the level lowering is performed between a fixed lower limit and a fixed upper limit.

5. Process according to claim 4, wherein the amplitudes of the tonal peaks are raised.

6. Process according to claim 5, wherein the raising of the tonal peaks is performed by a constant amount.

7. Process according to claim 5, wherein the raising of the tonal peaks is performed dynamically in a manner such that the greater the loudness of the total sound signal, as indicated by the loudness indicator, the greater the raising of the tonal peaks.

8. Process according to claim 7, wherein the level raising of the tonal peaks is a linear function of the loudness indicator.

9. Process according to claim 8, wherein the level raising is performed between a fixed lower limit and a fixed upper limit.

10. Process according to claim 1, wherein the total band of audible frequencies is divided into numerous partial bands for each of which the process steps are separately performed so as to cause the dynamic noise lowering in each partial band to follow its own characteristic curve.

11. Process according to claim 10, wherein the dividing of the total band of audible frequencies into partial bands is performed so as to create bands of unequal widths according to Bark ranges.

12. Process according to claim 10, wherein the dividing of the total band frequencies is performed so as to create partial bands of equal widths.

13. Process according to claim 1, wherein sone loudness is used as loudness indicator.

14. Process according to claim 1, wherein decibel intensity level is used as loudness indicator.

15. Process according to claim 1, wherein the amplitudes of the tonal peaks are raised.

16. Process according to claim 15, wherein the raising of the tonal peaks is performed by a constant amount.

17. Process according to claim 15, wherein the raising of the tonal peaks is performed dynamically in a manner such that the greater the loudness of the total sound signal, as indicated by the loudness indicator, the greater the raising of the tonal peaks.

18. Process according to claim 17, wherein the level raising of the tonal peaks is a linear function of the loudness indicator.

19. Process according to claim 18, wherein the level raising is performed between a fixed lower limit and a fixed upper limit.

* * * * *